US007709926B2

(12) United States Patent
Abadeer et al.

(10) Patent No.: US 7,709,926 B2
(45) Date of Patent: May 4, 2010

(54) DEVICE STRUCTURES FOR ACTIVE DEVICES FABRICATED USING A SEMICONDUCTOR-ON-INSULATOR SUBSTRATE AND DESIGN STRUCTURES FOR A RADIOFREQUENCY INTEGRATED CIRCUIT

(75) Inventors: Wagdi W. Abadeer, Jericho, VT (US); Kiran V. Chatty, Williston, VT (US); Robert J. Gauthier, Hinesburg, VT (US); Jed H. Rankin, Richmond, VT (US); Robert R. Robison, Colchester, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 12/108,924

(22) Filed: Apr. 24, 2008

(65) Prior Publication Data
US 2009/0267178 A1    Oct. 29, 2009

(51) Int. Cl.
*H01L 29/06*    (2006.01)
(52) U.S. Cl. .................. 257/510; 257/506; 257/509; 257/513; 257/E29.019; 257/E29.02
(58) Field of Classification Search .......... 257/506, 257/509, 510, 513, E29.019, E29.02
See application file for complete search history.

(56) References Cited

U.S. PATENT DOCUMENTS

| | | | |
|---|---|---|---|
| 5,434,444 A * | 7/1995 | Nakagawa et al. ......... 257/487 |
| 5,943,578 A | 8/1999 | Katakabe et al. | |
| 6,437,417 B1 | 8/2002 | Gilton | |
| 6,864,152 B1 | 3/2005 | Mirbedini et al. | |
| 7,164,174 B2 * | 1/2007 | Springer ..................... 257/370 |
| 7,189,628 B1 | 3/2007 | Mirbedini et al. | |
| 7,298,008 B2 * | 11/2007 | Gauthier et al. ............. 257/347 |
| 7,538,373 B2 * | 5/2009 | Ellis-Monaghan et al. .. 257/292 |
| 7,560,326 B2 * | 7/2009 | Mocuta et al. .............. 438/197 |
| 2005/0037524 A1 * | 2/2005 | Matsumoto et al. .......... 438/14 |
| 2007/0262386 A1 * | 11/2007 | Gossner et al. ............. 257/355 |
| 2007/0267700 A1 * | 11/2007 | Russ et al. ................. 257/355 |
| 2009/0090969 A1 * | 4/2009 | Li et al. ..................... 257/347 |

OTHER PUBLICATIONS

USPTO, Office Action issued in related U.S. Appl. No. 12/108,851 dated Jun. 9, 2009.

* cited by examiner

*Primary Examiner*—Victor A Mandala
(74) *Attorney, Agent, or Firm*—Wood, Herron & Evans, LLP

(57) ABSTRACT

Device structure for active devices fabricated in a semiconductor-on-insulator (SOI) substrate and design structures for a radiofrequency integrated circuit. The device structure includes a first isolation region in the semiconductor layer that extends from a top surface of a semiconductor layer to a first depth, a second isolation region in the semiconductor layer that extends from the top surface of the semiconductor layer to a second depth greater than the first depth, and a first doped region in the semiconductor layer. The first doped region is disposed vertically between the first isolation region and an insulating layer disposed between the semiconductor layer and a handle wafer of the SOI substrate. The device structure may be included in a design structure embodied in a machine readable medium for designing, manufacturing, or testing an integrated circuit.

13 Claims, 7 Drawing Sheets

US 7,709,926 B2

DEVICE STRUCTURES FOR ACTIVE DEVICES FABRICATED USING A SEMICONDUCTOR-ON-INSULATOR SUBSTRATE AND DESIGN STRUCTURES FOR A RADIOFREQUENCY INTEGRATED CIRCUIT

CROSS-REFERENCE TO RELATED APPLICATIONS

This application is related to application Ser. No. 12/108,851 filed on Apr. 24, 2008 and entitled "Methods For Fabricating Active Devices On A Semiconductor-On-Insulator Substrate Utilizing Multiple Depth Shallow Trench Isolations," the disclosure of which is hereby incorporated by reference herein in its entirety.

FIELD OF THE INVENTION

The invention relates generally to semiconductor device fabrication and, in particular, to active devices fabricated using semiconductor-on-insulator substrates, as well as design structures for a radiofrequency integrated circuit.

BACKGROUND OF THE INVENTION

Junction-type active devices are readily implemented in bulk complementary-metal-oxide (CMOS) technologies and semiconductor-on-insulator (SOI) technologies. For example, bipolar junction transistors are formed by a pair of P-N junctions, namely an emitter-base junction and a collector-base junction. An NPN bipolar junction transistor has a thin region of P-type material constituting the base region between two regions of N-type material constituting the emitter and collector regions. A PNP bipolar junction transistor has a thin region of N-type material constituting the base region between two regions of P-type material constituting the emitter and collector regions. The movement of electrical charge carriers between the collector region and the emitter region, which produces electrical current flow, is controlled by a voltage applied across the emitter-base junction.

Conventional planar bipolar junction transistors, which are commonly implemented in radiofrequency integrated circuits, have a vertical arrangement of the emitter, base, and collector regions in which the emitter region is circumscribed by the base region and the collector region circumscribes the base region. As a result, the emitter and base regions of a bipolar junction transistor having a vertical architecture and must be situated between the collector region and a top surface of the substrate. For SOI substrates with thin device layers, the ability to maintain the vertical architecture of the bipolar junction transistor is lost. Conventional planar bipolar junction transistors also have a relatively large footprint that consumes a significant surface area of the SOI layer. The device footprint cannot be reduced because the area of the emitter-base junction cannot be easily scaled.

A semiconductor-controlled rectifier, which are also commonly implemented in radiofrequency integrated circuits, is a four-layer junction-type active device with a construction that is related to the construction of bipolar junction transistors. The construction of a semiconductor-controlled rectifier is similar in construction to a combination of two bipolar junctions that operate in conjunction to control device current flow. Consequently, semiconductor-controlled rectifiers face the same challenges as bipolar junction transistors for implementation in SOI technologies.

What is needed, therefore, are device structures for active junction-type active devices that overcome these and other deficiencies of conventional active junction-type active devices fabricated using an SOI technology substrate, as well as related design structures for radiofrequency integrated circuits (RFIC).

SUMMARY OF THE INVENTION

In accordance with an embodiment of the invention, a device structure is provided that is manufactured in a semiconductor-on-insulator substrate having a semiconductor layer, a handle wafer, and an insulating layer between the semiconductor layer and the handle wafer. The device structure includes a first isolation region in the semiconductor layer that extends from a top surface of the semiconductor layer to a first depth, a second isolation region in the semiconductor layer that extends from the top surface of the semiconductor layer to a second depth greater than the first depth, and a first doped region in the semiconductor layer. The first doped region is disposed vertically in a stacked arrangement between the first isolation region and the insulating layer.

In another embodiment, the device structure may be included in a design structure embodied in a machine readable medium for designing, manufacturing, or testing an integrated circuit. The design structure may comprise a netlist. The design structure may also reside on storage medium as a data format used for the exchange of layout data of integrated circuits. The design structure may reside in a programmable gate array.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1A:
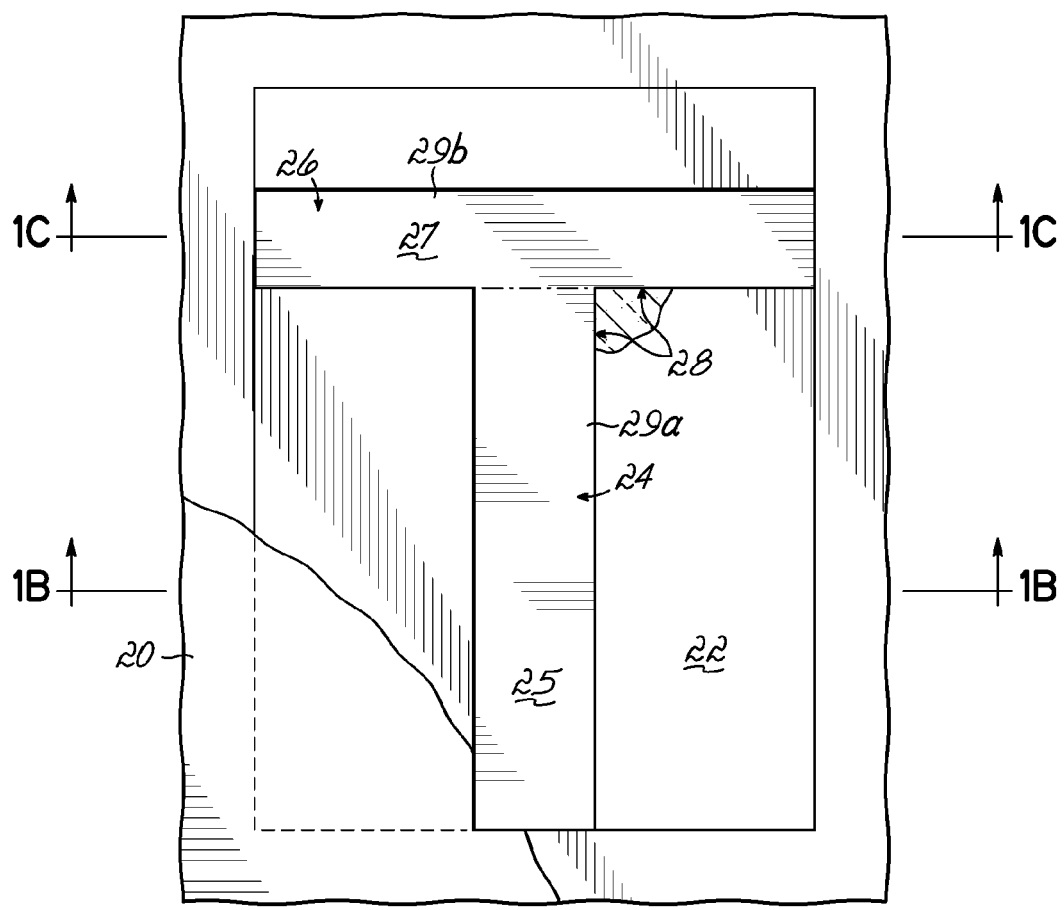
FIG. 1A is a diagrammatic top plan view of a device structure built on a portion of a semiconductor-on-insulator wafer at an initial fabrication stage according to a processing method in accordance with an embodiment of the invention.
Figure 1B:
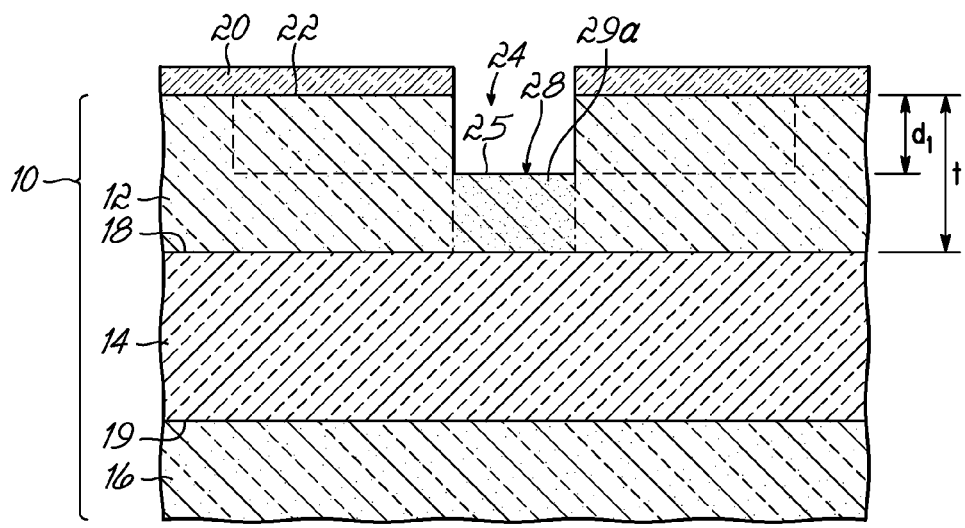
FIGS. 1B and 1C are diagrammatic cross-sectional views taken generally along line 1B-1B and line 1C-1C, respectively, in FIG. 1A.
Figure 1C:
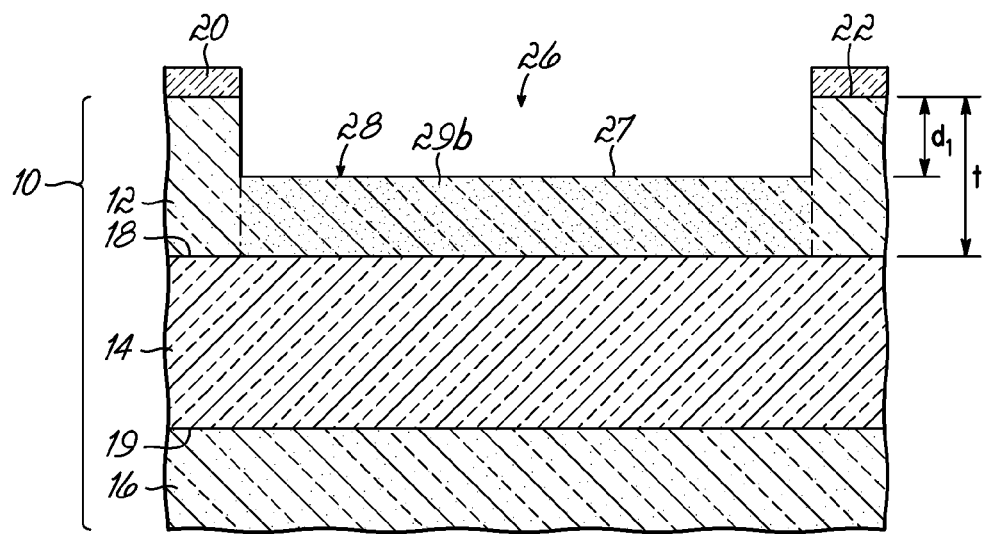

With reference to FIGS. 1A, 1B, 1C and in accordance with an embodiment of the invention, a semiconductor-on-insulator (SOI) substrate 10 includes a device or SOI layer 12, a buried insulating layer 14 formed of an electrically insulating material, and a handle wafer 16. The SOI layer 12 is separated from the handle wafer 16 by the intervening buried insulating layer 14. The buried insulating layer 14 electrically isolates the handle wafer 16 from the SOI layer 12, which is considerably thinner than the handle wafer 16. The SOI layer 12 is in direct contact with a top surface 18 of the buried insulating layer 14 to define an upper interface and the handle wafer 16 is in direct contact with a bottom surface 19 of the buried insulating layer 14 to define a lower interface separated from the upper interface by the thickness of the buried insulating layer 14 so that the SOI layer 12 and the handle wafer 16 have a non-contacting relationship. The SOI layer 12 has a thickness, t, that is measured between a top surface 22 of the SOI layer 12 and the top surface 18 of the buried insulating layer 14.

The SOI layer 12 is composed of single crystal or monocrystalline semiconductor material, such as silicon or a material that primarily contains silicon. The monocrystalline semiconductor material of the SOI layer 12 may contain a definite defect concentration and still be considered single crystal. The buried insulating layer 14 may be a buried oxide layer composed of silicon dioxide (e.g., $SiO_2$). The handle wafer 16 may also be constituted by a single crystal or monocrystalline semiconductor material, such as silicon, or another material recognized by a person having ordinary skill in the art. The SOI substrate 10 may be fabricated by any suitable conventional approach, such as a wafer bonding technique or a separation by implantation of oxygen (SIMOX) technique, familiar to a person having ordinary skill in the art.

A hardmask 20 is formed on the top surface 22 of the SOI layer 12. The hardmask 20 is composed of a material that etches selectively to the semiconductor material constituting the SOI layer 12 and that functions as a polish stop layer and reactive ion etch mask, as well as an ion implantation mask, during subsequent fabrication stages. In one embodiment, the hardmask 20 may be $SiO_2$ deposited on the top surface 22 by a thermal chemical vapor deposition (CVD) process.

Trenches 24, 26 are defined in the SOI layer 12 by a conventional lithography and etching process. The lithography process entails applying a resist (not shown) on hardmask 20, exposing the resist through a photomask to a pattern of radiation effective to create a latent pattern in the resist for a series of trenches, and developing the transferred pattern in the exposed resist. The trench pattern is transferred from the resist to the hardmask 20 using an anisotropic dry etch, such as reactive-ion etching (RIE) or a plasma etching process. The etching process may be conducted in a single etching step or multiple etching steps with different etch chemistries, including a standard silicon RIE process for the SOI layer 12. The trenches 24, 26 are initially transferred to the hardmask 20 as openings using the patterned resist as an etch mask. After the trenches 24, 26 are formed in the hardmask 20, etching is paused and residual resist is stripped by, for example, plasma ashing or a chemical stripper.

Using the patterned hardmask 20 as an etch mask, another anisotropic dry etch process is used to extend the trenches 24, 26 into the SOI layer 12. The trenches 24, 26 are registered spatially with the locations of the openings in the patterned hardmask 20. The depth, $d_1$, of the trenches 24, 26 extends only partially through the thickness, t, of the SOI layer 12 and, therefore, fails to extend to the depth of the top surface 18 of buried insulating layer 14. Generally, the depth, $d_1$, is measured between the top surface 22 of the SOI layer 12 and respective bottoms 25, 27 of the trenches 24, 26. In one embodiment, the depth, $d_1$, is approximately one-half of the thickness, t, of the SOI layer 12.

A doped region 28 is formed in the semiconductor material of the SOI layer 12 by an ion implantation process that relies on the patterned hardmask 20 as an implantation mask. The trenches 24, 26 self-align the trajectories of the implanted ions so that only portions of the SOI layer 12 exposed by the respective bottoms 25, 27 of the trenches 24, 26 for ion impingement receive an ion dose during the ion implantation process. The semiconductor material of the doped region 28 is characterized by a conductivity type that is the same as the conductivity type of the semiconductor material constituting the handle wafer 16. For example, the semiconductor material in the doped region 28 may be doped to have a p-type conductivity. Suitable p-type impurities are Group III dopants that include, but are not limited to, boron or indium. The ion dose and ion kinetic energy are selected to dope the semiconductor material constituting the doped region 28 at an appropriate dopant concentration selected for the device design and the thickness of the hardmask 20 is selected such that hardmask 20 serves as an implantation mask protecting the covered portions of the SOI layer 12.

Figure 2A:
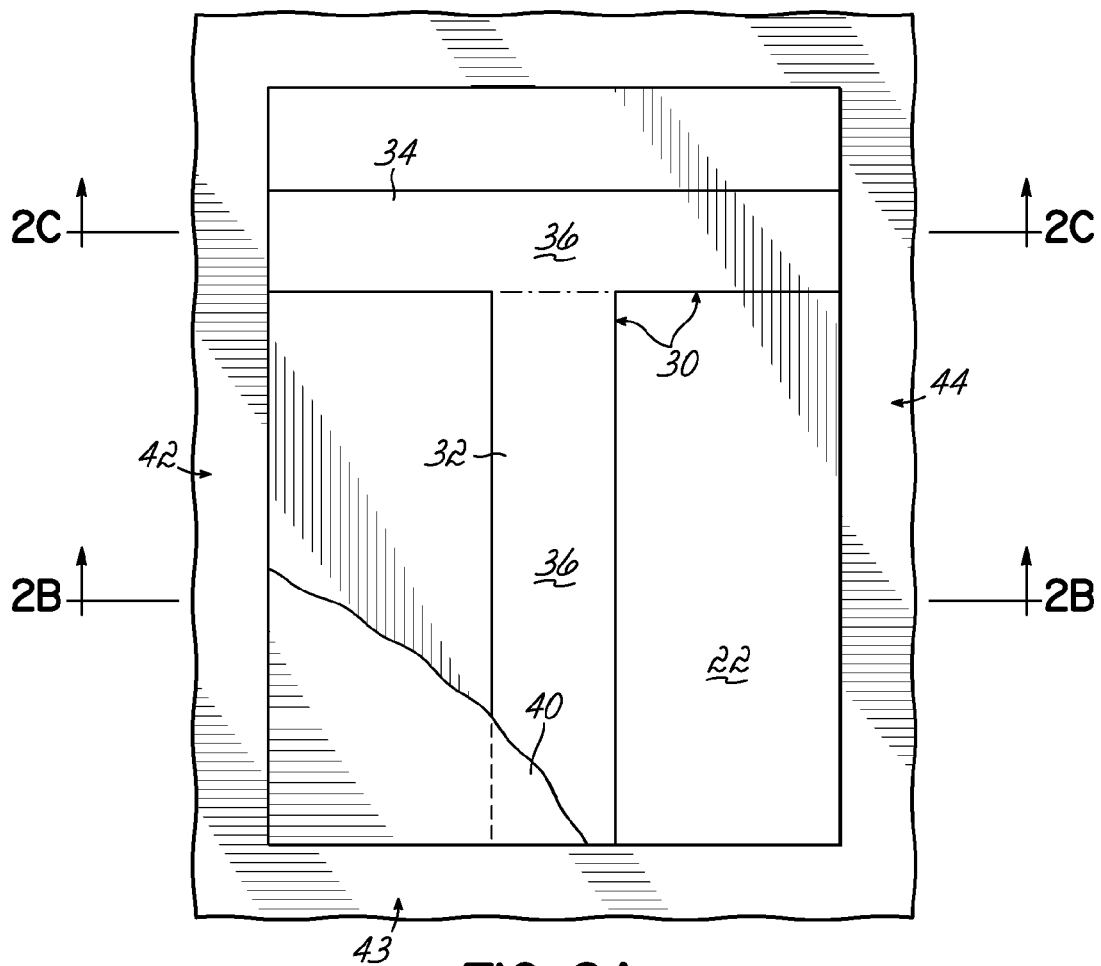
FIG. 2A is a diagrammatic top plan view of the device structure of FIG. 1A at a subsequent fabrication stage.
Figure 2B:
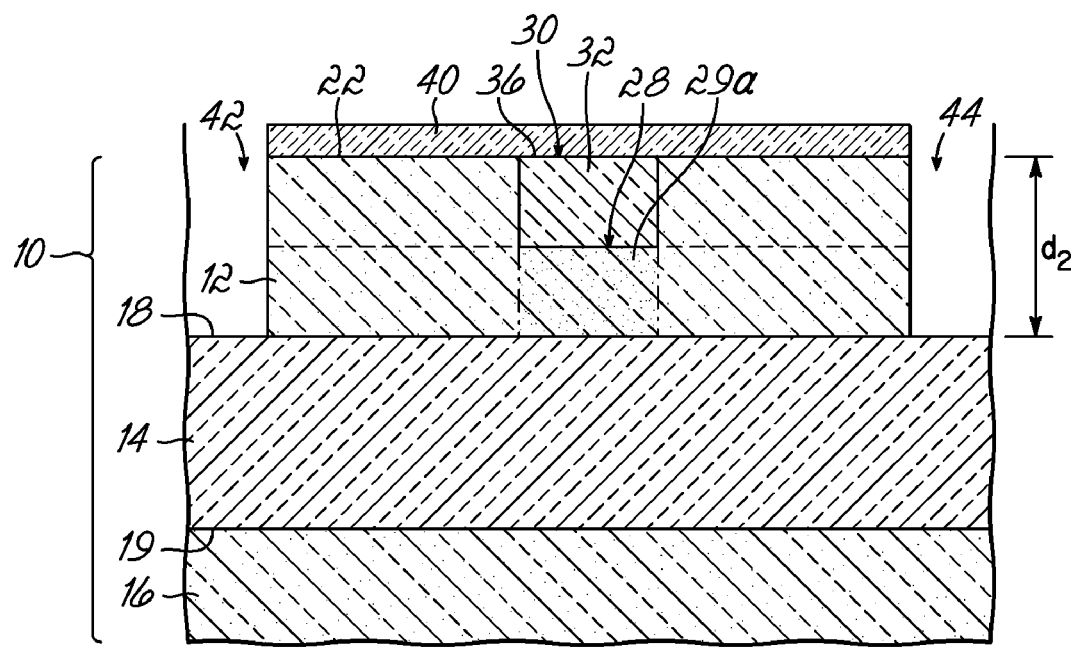
FIGS. 2B and 2C are diagrammatic cross-sectional views taken generally along line 2B-2B and line 2C-2C, respectively, in FIG. 2A.
Figure 2C:
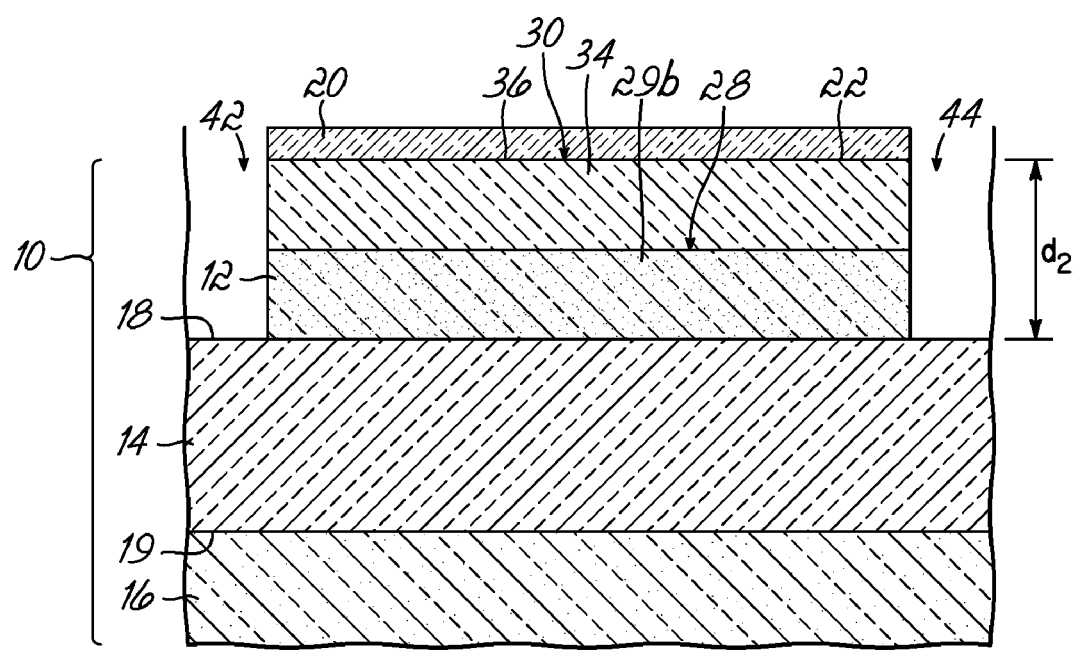

With reference to FIGS. 2A, 2B, 2C in which like reference numerals refer to like features in FIGS. 1A, 1B, 1C and at a subsequent fabrication stage, a first isolation region, generally indicated by reference numeral 30, is formed in the trenches 24, 26 in SOI layer 12. The first isolation region 30 includes dielectric regions 32, 34 formed by depositing a dielectric material to fill the trenches 24, 26 and then planarizing the deposited dielectric material with a chemical-mechanical polishing (CMP) process or any other suitable planarization technique. The planarization process stops at the top surface 22 of the SOI layer 12, which leaves embedded dielectric material as dielectric regions 32, 34 that have a top surface 36 coplanar with the top surface 22 of the SOI layer 12. One of the dielectric regions 32 overlies a portion 29a of doped region 28 and the other of the dielectric regions 34 overlies a different portion 29b of doped region 28.

Another hardmask 40 is formed on the top surface 22 of the SOI layer 12. Hardmask 40 is composed of a material that etches selectively to the semiconductor material constituting the SOI layer 12 and that functions as a polish stop layer and reactive ion etch mask, as well as an ion implantation mask, during subsequent fabrication stages. In one embodiment, the hardmask 40 may be $SiO_2$ deposited on the top surface 22 by a thermal CVD process.

Trenches, including the representative trenches 42, 43, 44, are defined in the SOI layer 12 by a conventional lithography and etching process. The lithography process entails applying a resist (not shown) on hardmask 40, exposing the resist through a photomask to a pattern of radiation effective to create a latent pattern in the resist for a series of trenches, and developing the transferred pattern in the exposed resist. The trench pattern is transferred from the resist to the hardmask 40 using an anisotropic dry etch, such as RIE or a plasma etching process. The etching process may be conducted in a single etching step or multiple etching steps with different etch chemistries, including a standard silicon RIE process for the SOI layer 12. The trenches 42, 43, 44 are initially transferred to the hardmask 40 using the patterned resist as an etch mask. After the trenches 42, 43, 44 are formed in the hardmask 40, etching is paused and residual resist is stripped by, for example, plasma ashing or a chemical stripper.

Using the patterned hardmask 40 as an etch mask, another anisotropic dry etch process is used to extend the trenches 42, 43, 44 into the SOI layer 12. The depth, $d_2$, of the trenches 42, 43, 44 is greater than the depth, d1, of the trenches 24, 26. In a representative embodiment, the depth, $d_2$, of the trenches 42, 43, 44 extends through the entire thickness, t, of the SOI layer 12 so that the trenches 42, 44 expose the top surface 18 of buried insulating layer 14, which may be used as an etch stop. The trenches 42, 43, 44 intersect with the trenches 24, 26 and, therefore, with the dielectric regions 32, 34 of the first isolation region 30.

Figure 3A:
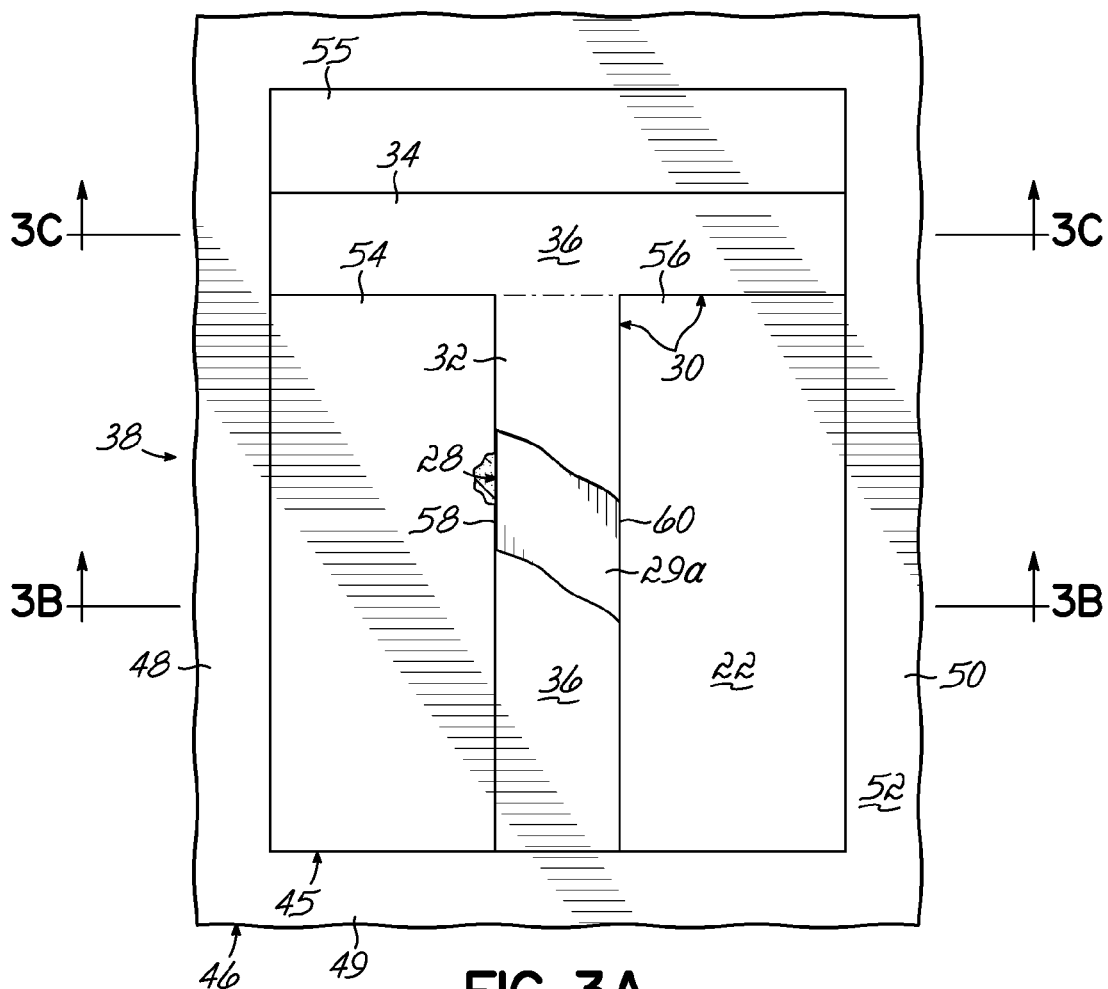
FIG. 3A is a diagrammatic top plan view of the device structure of FIG. 2A at a subsequent fabrication stage.
Figure 3B:
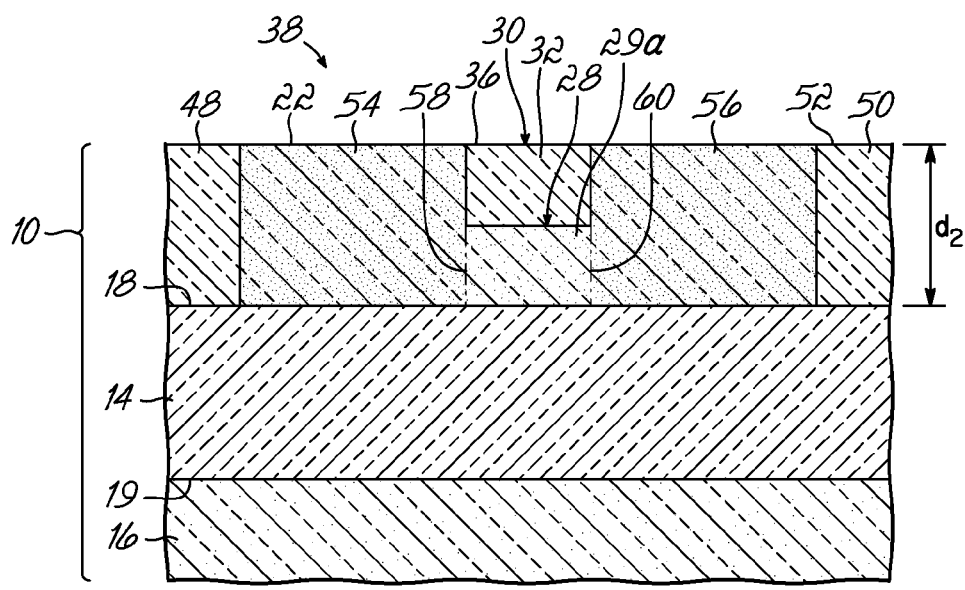
FIGS. 3B and 3C are diagrammatic cross-sectional views taken generally along line 3B-3B and line 3C-3C, respectively, in FIG. 3A.
Figure 3C:
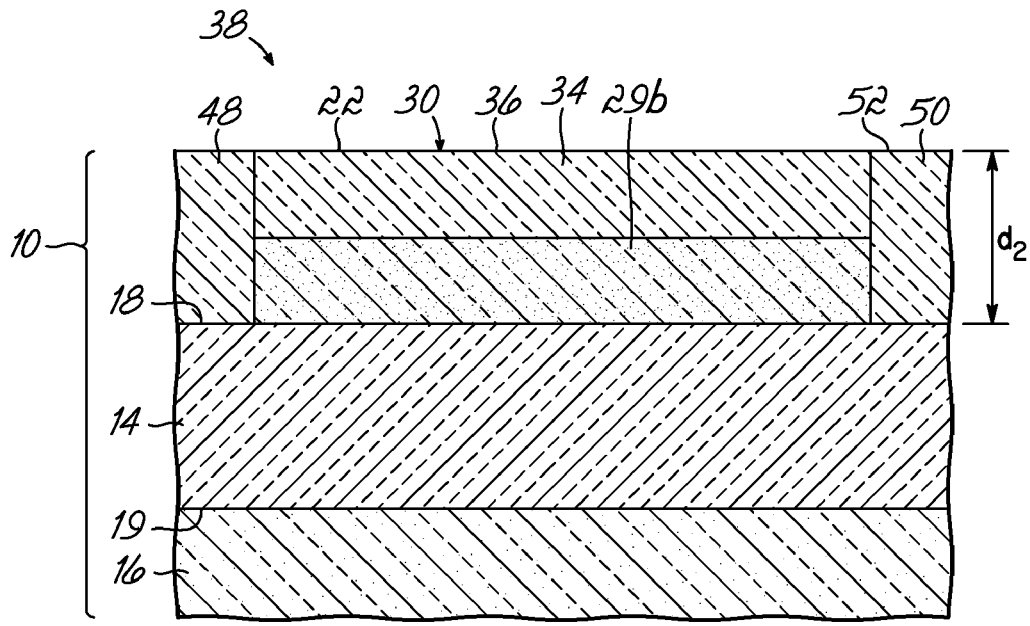

With reference to FIGS. 3A, 3B, 3C in which like reference numerals refer to like features in FIGS. 2A, 2B, 2C and at a subsequent fabrication stage, a second isolation region, generally indicated by reference numeral 46, is formed that consists of dielectric regions 48, 49, 50 that physically reside in the trenches 42, 43, 44 of SOI layer 12. Similar to dielectric regions 32, 34, the dielectric regions 48, 49, 50 are formed by depositing a dielectric material that fills the trenches 42, 43, 44 and then planarizing the deposited dielectric material with a CMP process or any other suitable planarization technique. The planarization process stops at the top surface 22 of the SOI layer 12, which leaves embedded dielectric material as regions 48, 49, 50 that also have a top surface 52 coplanar with the top surface 22 of the SOI layer 12. Dielectric region 34 spans between the dielectric regions 48, 50 and dielectric region 32 extends between dielectric region 34 and dielectric region 49. The depth, $d_2$, of the trenches 42, 43, 44 is selected such that the isolation region 46 electrically isolates a device region 45 of the SOI layer 12 from adjacent device regions (not shown).

The dielectric material in the isolation regions 30, 46 may be composed of an oxide such as densified tetraethylorthosilicate (TEOS) deposited by thermal CVD or a high density plasma (HDP) oxide.

Another patterned hardmask (not shown) is applied to the top surface 22 of the SOI layer 12. An ion implantation process is applied to form heavily doped regions 54, 56 of the SOI layer 12, which are unmasked, to have the same conductivity type as each other. The heavily doped regions 54, 56 flank the doped region 28, which is buried between the dielectric region 32 and the buried insulating layer 14. The semiconductor material of the heavily doped regions 54, 56 has an opposite conductivity type to the semiconductor material of the doped region 28. For example, the semiconductor material of the doped regions 54, 56 may have n-type conductivity. Suitable n-type dopants in silicon are Group V dopants that include, but are not limited to, arsenic, phosphorus, and antimony. The ion dose and ion kinetic energy are selected to dope the semiconductor material constituting the doped regions 54, 56 at an appropriate dopant concentration selected for the device design and the hardmask serves as an implantation mask that protects the doped region 28. A top surface of each of the doped regions 54, 56 is coextensive with the top surface 22 of the SOI layer 12, so that the doped regions 54, 56 are accessible for establishing contacts.

Another heavily doped region 55 (FIG. 3A) is formed in the semiconductor material of the SOI layer 12 by an ion implantation process that relies on yet another patterned hardmask (not shown) as an implantation mask. The doped region 55 is disposed adjacent to the heavily doped regions 54, 56 but separated from the doped regions 54, 56 by dielectric region 34. The semiconductor material of the doped region 55, which is electrically connected in a direct manner with portion 29b of doped region 28, is characterized by the same conductivity type as the semiconductor material of the doped region 28. For example, the semiconductor material in doped region 55 may be doped to have a p-type conductivity. Doped region 55 has a top surface coextensive with the top surface 22 of the SOI layer 12 and is present to function as a highly conductive contact for the doped region 28. Doped region 55 is separated from the doped regions 54, 56 by dielectric region 34.

A device structure, generally indicated by reference numeral 38, results that may either have an NPN construction or a PNP construction, which is contingent upon the doping of the semiconductor material during processing, characteristic of a bipolar junction transistor. The device structure 38 includes doped region 28, which operates as a base region of the bipolar junction transistor, and doped regions 54, 56 that operate as emitter and collector regions of the bipolar junction transistor. A first p-n junction 58 is defined along the interface of direct contact between doped regions 28, 54. A second p-n junction 60 is defined along the interface of direct contact between doped regions 28, 56. The junctions 58, 60 function as respective emitter-base and collector-base junctions in the device structure 38. The doped regions 28, 54, 56 have a lateral arrangement in the device structure 38.

Isolation region 46 electrically isolates the device structure 38 in the device region 45 from device structures in adjacent device regions (not shown) of the SOI layer 12. Isolation region 30 electrically isolates the adjacent doped regions 54, 56 from each other in the device structure 38 and physically overlies the doped region 28. Doped region 28 is disposed vertically in a stacked arrangement between the dielectric region 32 of the first isolation region 30 and the buried insulating layer 14.

Standard CMOS processing also transpires for the low voltage field effect transistors of the integrated circuit fabricated on the SOI wafer 10. Wells are formed and activated by a stabilization anneal that also removes any lattice damage produced by the well formation process. Gate electrode stacks are formed by conventional processes and the source/drain regions are defined by a series of ion implantation steps. Contacts to the device structure 38 may be formed by the same CMOS process that supplies contacts for the CMOS field effect transistors. After the devices are completed, standard BEOL processing follows that includes formation of interlayer dielectric layers, conductive vias, and metallization for interconnect wiring levels.

Figure 3D:
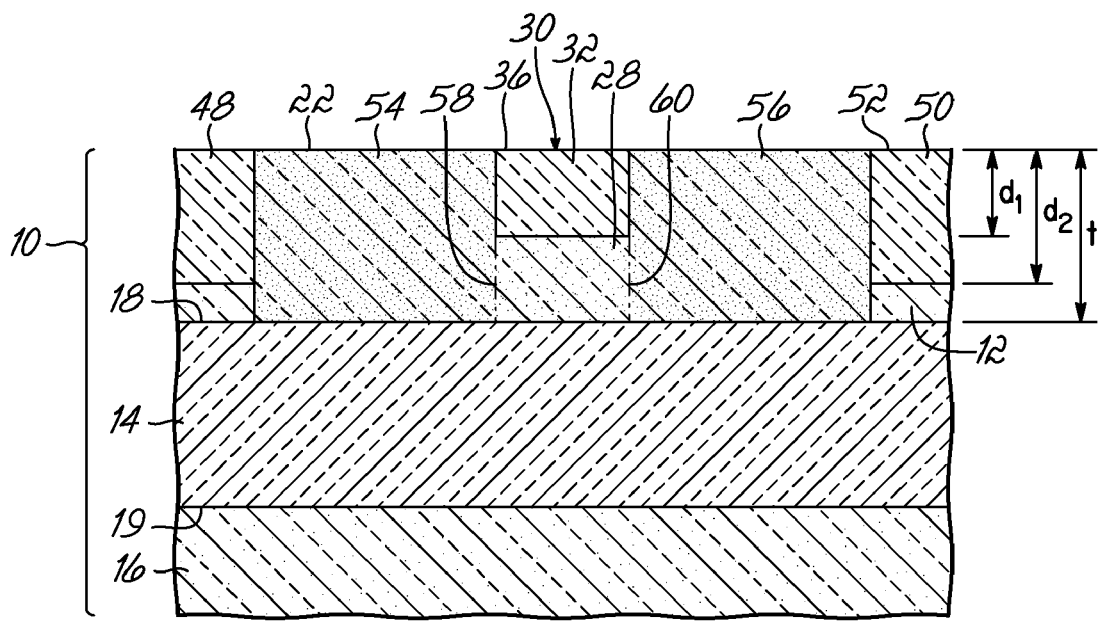
FIG. 3D is a diagrammatic cross-sectional view similar to FIG. 3B of a device structure in accordance with an alternative embodiment of the invention.

In an alternative embodiment shown in FIG. 3D, the depth, $d_2$, of the trenches 42, 43, 44 may differ from the depth, $d_1$, of the trenches 24, 26 but still not reach the top surface 18 of buried insulating layer 14. As a result, the dielectric regions 48, 49, 50 fail to extend to the top surface 18 of buried insulating layer 14 and, instead, only extend through a fraction of the thickness, t, of the SOI layer 12.

Figure 4A:
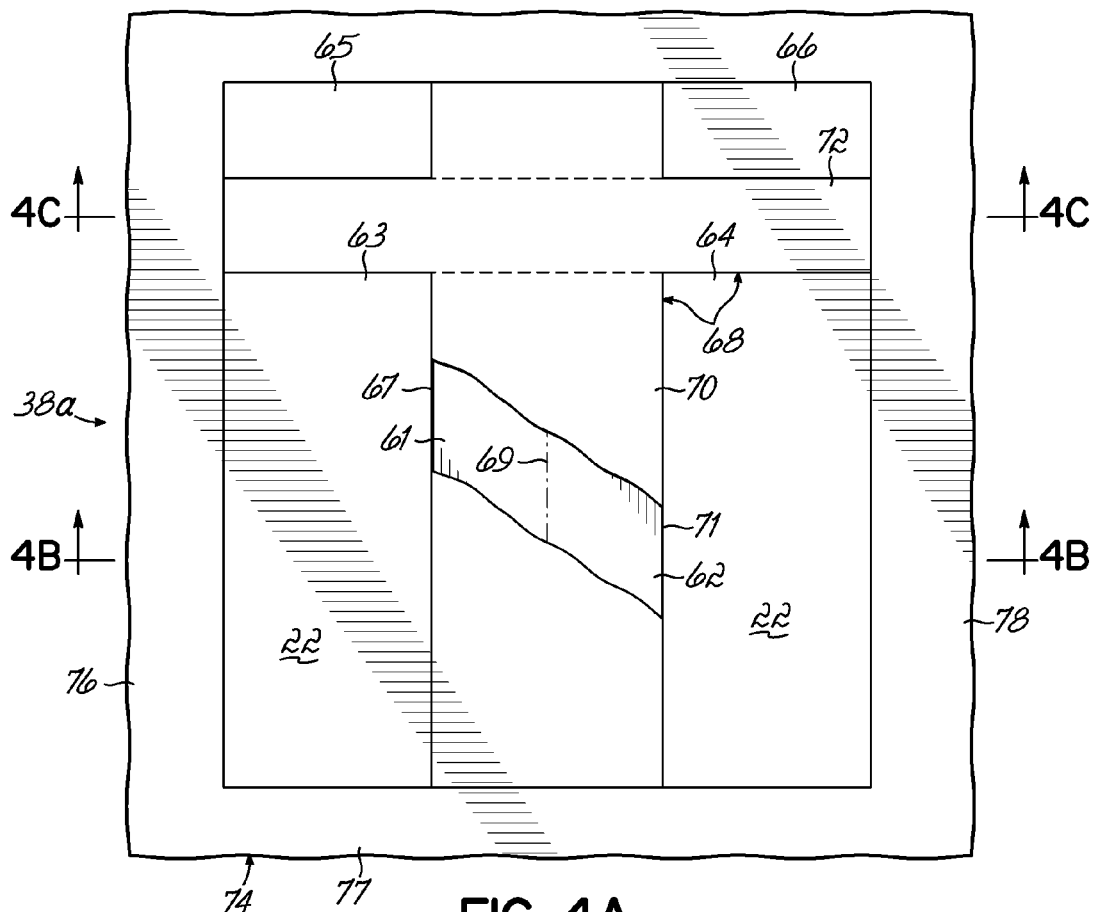
FIG. 4A is a diagrammatic top plan view of a device structure built on a portion of a semiconductor-on-insulator wafer in accordance with an alternative embodiment of the invention.
Figure 4B:
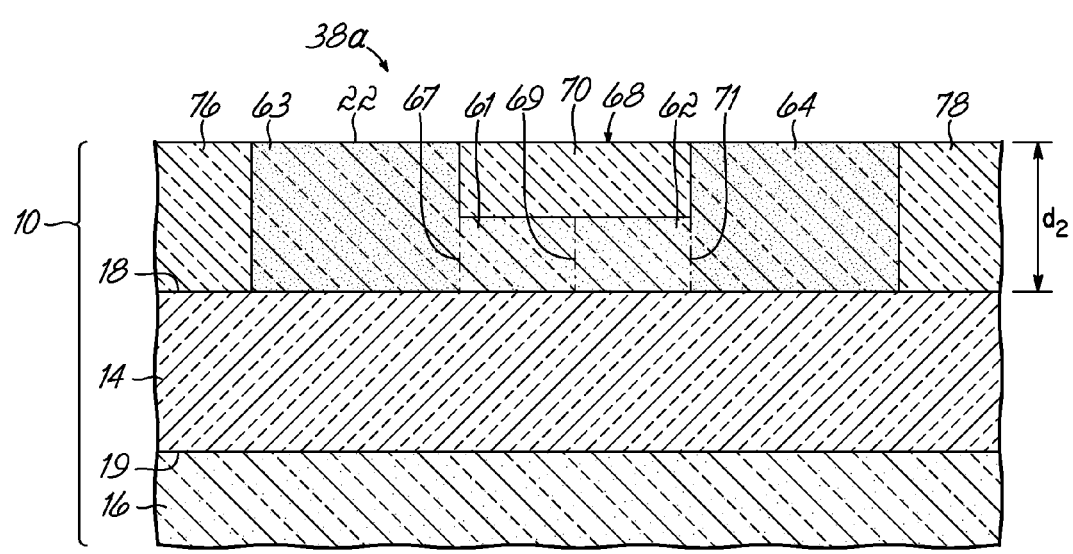
FIGS. 4B and 4C are diagrammatic cross-sectional views taken generally along line 4B-4B and line 4C-4C, respectively, in FIG. 4A.
Figure 4C:
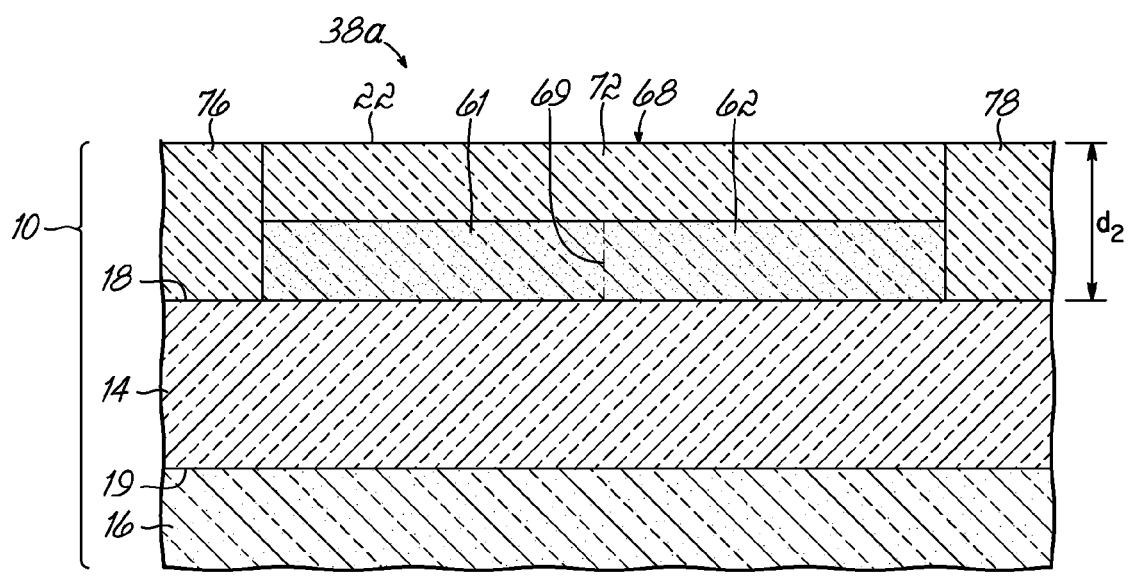

With reference to FIGS. 4A, 4B, 4C in which like reference numerals refer to like features in FIGS. 3A, 3B, 3C and in accordance with an alternative embodiment of the invention, a device structure 38a includes first and second buried doped regions 61, 62 of the semiconductor material of SOI layer 12 with opposite conductivity type. The device structure 38a further includes first and second heavily doped regions 63, 64 of the semiconductor material of SOI layer 12 situated in buried doped regions 61, 62, respectively. Heavily doped regions 63, 64, which are accessible at the top surface 22 of the SOI layer 12, have opposite conductivity types than the respective doped regions 61, 62 and each other. Additional heavily doped regions 65, 66 of opposite conductivity type are accessible at the top surface 22 of the SOI layer 12 to provide electrical contacts with the buried doped regions 61, 62, respectively.

The device structure 38a includes a first isolation region, generally indicated by reference numeral 68, that consists of dielectric regions 70, 72 that are formed in a manner similar to, and have a construction similar to, dielectric regions 32, 34 of isolation region 30 (FIGS. 3A, 3B). Dielectric region 70 overlies doped regions 61, 62. A second isolation region, generally indicated by reference numeral 74, that consists of dielectric regions 76, 77, 78 that are formed in a manner similar to, and have a construction similar to, dielectric regions 48, 49, 50 (FIGS. 3A, 3B) of isolation region 46. Similar to the relationship between dielectric regions 32, 34 and the dielectric regions 76, 78, dielectric regions 76, 78 extend to a greater depth in the SOI layer 12 than the dielectric regions 70, 72. Although dielectric regions 76, 77, 78 are depicted in FIGS. 4A, 4B as contacting the buried insulating layer 14, the dielectric regions 76, 77, 78 must only extend to a greater depth in the SOI layer 12 than dielectric regions 70, 72 and do not have to extend completely through the thickness, t, of the SOI layer 12 to contact the buried insulating layer 14, as shown in FIG. 3D with regard to isolation region 30.

The device structure 38a may either have a PNPN construction or a NPNP construction, which is contingent upon the conductivity type of the semiconductor material in the doped regions 61-64 of the SOI layer 12. A first p-n junction 67 is defined along the interface of direct contact between doped regions 61, 63. A second p-n junction 69 is defined beneath the isolation region 68 along the interface of direct contact between doped regions 61, 62. A third p-n junction 71 is defined along the interface of direct contact between doped regions 62, 64. The doped regions 61-64 have a lateral arrangement in the device structure 38a. The device structure 38a may be considered to have the construction of a semiconductor-controlled rectifier.

Isolation region 74 electrically isolates the device structure 38a from adjacent device structures (not shown) in adjacent regions of the SOI layer 12. Isolation region 68 electrically isolates the adjacent doped regions 63, 64 from each other in the device structure 38a. Doped regions 61, 62, as well as the second P-N junction 69, are disposed vertically in a stacked arrangement between the dielectric region 70 of the first isolation region 68 and the buried insulating layer 14.

Figure 5:
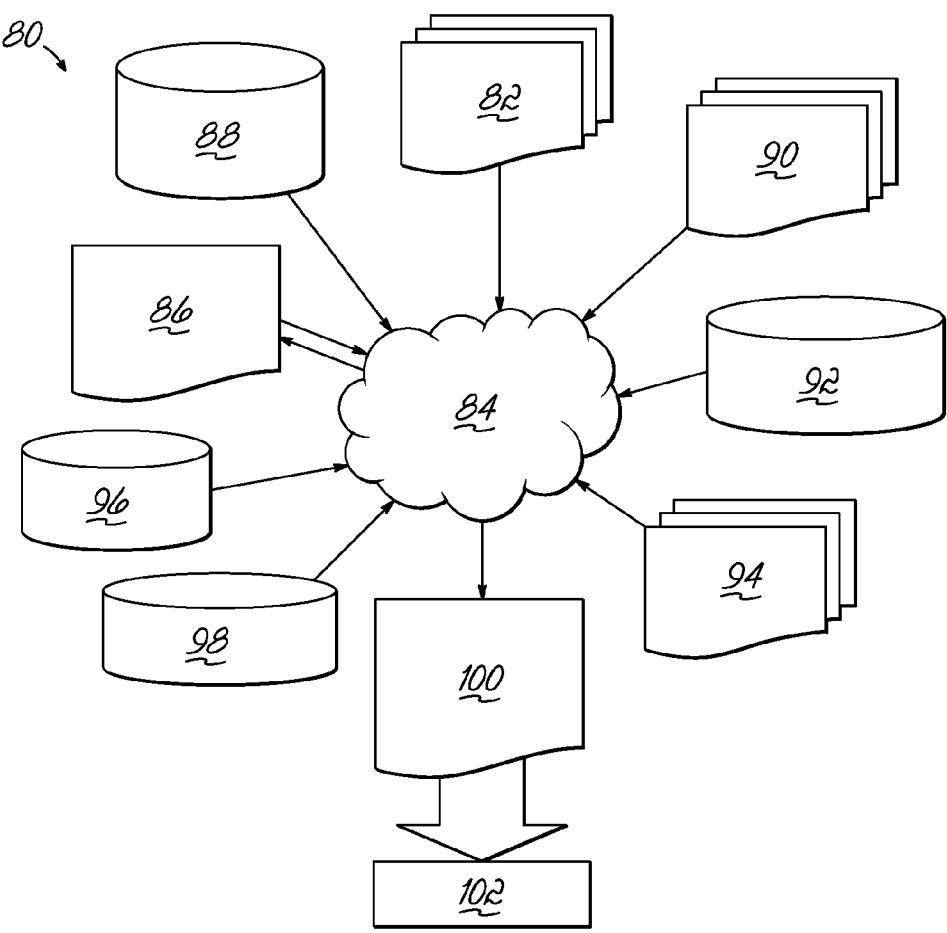
FIG. 5 is a flow diagram of a design process used in semiconductor design, manufacture, and/or test.

FIG. 5 shows a block diagram of an exemplary design flow 80 used for example, in semiconductor design, manufacturing, and/or test. Design flow 80 may vary depending on the type of IC being designed. For example, a design flow 80 for building an application specific IC (ASIC) may differ from a design flow 80 for designing a standard component or from a design flow 80 for instantiating the design into a programmable array, for example a programmable gate array (PGA) or a field programmable gate array (FPGA) offered by ALTERA® Inc. or XILINX® Inc. Design structure 82 is preferably an input to a design process 84 and may come from an IP provider, a core developer, or other design company or may be generated by the operator of the design flow, or from other sources. Design structure 82 comprises an embodiment of the invention as shown in FIGS. 3A, 3B, 3C, FIG. 3D, or FIGS. 4A, 4B, 4C in the form of schematics or HDL, a hardware-description language (e.g., Verilog, VHDL, C, etc.). Design structure 82 may be contained on one or more machine readable medium. For example, design structure 82 may be a text file or a graphical representation of an embodiment of the invention as shown in FIGS. 3A, 3B, 3C, FIG. 3D, or FIGS. 4A, 4B, 4C. Design process 84 preferably synthesizes (or translates) an embodiment of the invention as shown in FIGS. 3A, 3B, 3C, FIG. 3D, or FIGS. 4A, 4B, 4C into a netlist 86, where netlist 86 is, for example, a list of wires, transistors, logic gates, control circuits, 110, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 86 is resynthesized one or more times depending on design specifications and parameters for the circuit.

Design process 84 may include using a variety of inputs; for example, inputs from library elements 88 which may house a set of commonly used elements, circuits, and devices, including models, layouts, and symbolic representations, for a given manufacturing technology (e.g., different technology nodes, 32 nm, 45 nm, 90 nm, etc.), design specifications 90, characterization data 92, verification data 94, design rules 96, and test data files 98 (which may include test patterns and other testing information). Design process 84 may further include, for example, standard circuit design processes such as timing analysis, verification, design rule checking, place and route operations, etc. One of ordinary skill in the art of integrated circuit design can appreciate the extent of possible electronic design automation tools and applications used in design process 84 without deviating from the scope and spirit of the invention. The design structure of the invention is not limited to any specific design flow.

Design process 84 preferably translates an embodiment of the invention as shown in FIGS. 3A, 3B, 3C, FIG. 3D, or FIGS. 4A, 4B, 4C, along with any additional integrated circuit design or data (if applicable), into a second design structure 100. Design structure 100 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 100 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 3A, 3B, 3C, FIG. 3D, or FIGS. 4A, 4B, 4C. Design structure 100 may then proceed to a stage 102 where, for example, design structure 100 proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present.

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A device structure manufactured in a semiconductor-on-insulator substrate having a semiconductor layer, a handle wafer, and a buried insulating layer between the semiconductor layer and the handle wafer, the device structure comprising:
    a first isolation region that includes a plurality of dielectric regions that extend from a top surface of the semiconductor layer to a first depth;
    a device region of the semiconductor layer surrounded by the plurality of dielectric regions of the first isolation region, the device region including a first doped region and a second doped region each extending from the top surface of the semiconductor layer to the buried insulating layer;
    a second isolation region in the semiconductor layer that extends from the top surface of the device region to a second depth shallower than the first depth, the second isolation region disposed laterally between the first doped region and the second isolation region; and
    a third doped region in the semiconductor layer, the third doped region oppositely doped relative to the first doped region, the third doped region defining a first p-n junction along an interface of direct contact with the first doped region, and the third doped region disposed vertically in a stacked arrangement between the second isolation region and the buried insulating layer.

2. The device structure of claim 1 wherein the semiconductor layer has a thickness measured from the top surface to the insulating layer, and the first depth of the plurality of dielectric regions extends through the thickness of the semiconductor layer to the buried insulating layer.

3. The device structure of claim 1 wherein the third doped region defines a second p-n junction along an interface of direct contact with the second doped region.

4. The device structure of claim 1 further comprising:
    a fourth doped region in the semiconductor layer, the second doped region disposed vertically between the second isolation region and the buried insulating layer, the second doped region disposed laterally between the second doped region and the third doped region, and the fourth doped region having an opposite conductivity type to the second and third doped region so as to define a second p-n junction along an interface of direct contact between the second and fourth doped regions and a third p-n junction along an interface of direct contact between the third and fourth doped regions.

5. The device structure of claim 1 wherein the first depth for the plurality of dielectric regions is less than the thickness of the semiconductor layer.

6. A design structure embodied in a machine readable medium for designing, manufacturing, or testing an integrated circuit, the design structure comprising:
    a semiconductor-on-insulator substrate having a semiconductor layer, a handle wafer, and a buried insulating layer between the semiconductor layer and the handle wafer;
    a first isolation region that includes a plurality of dielectric regions that extends extend from a top surface of the semiconductor layer to a first depth;
    a device region of the semiconductor layer surrounded by the plurality of dielectric regions of the first isolation region, the device region including a first doped region and a second doped region each extending from the top surface of the semiconductor layer to the buried insulating layer;
    a second isolation region in the semiconductor layer that extends from the top surface of the device region to a second depth shallower than the first depth, the second isolation region disposed laterally between the first doped region and the second isolation region; and
    a third doped region in the semiconductor layer, the third doped region oppositely doped relative to the first device region, the first doped region defining a first p-n junction along an interface of direct contact with the first device region, and the first doped region disposed vertically in a stacked arrangement between the second isolation region and the buried insulating layer.

7. The design structure of claim 6 wherein the design structure comprises a netlist.

8. The design structure of claim 6 wherein the design structure resides on storage medium as a data format used for the exchange of layout data of integrated circuits.

9. The design structure of claim 6 wherein the design structure resides in a programmable gate array.

10. The design structure of claim 6 wherein the third doped region defines a second p-n junction along an interface of direct contact with the second doped region.

11. The design structure of claim 6 further comprising:
    a fourth doped region in the semiconductor layer, the second doped region disposed vertically between the second isolation region and the buried insulating layer, the second doped region disposed laterally between the second doped region and the third doped region, and the fourth doped region having an opposite conductivity type to the second and third doped region so as to define a second p-n junction along an interface of direct contact between the second and fourth doped regions and a third p-n junction along an interface of direct contact between the third and fourth doped regions.

12. The design structure of claim 6 wherein the first depth for the plurality of dielectric regions is equal to the thickness of the semiconductor layer so that the plurality of dielectric regions extend from the top surface of the semiconductor layer to the buried insulating layer.

13. The design structure of claim 6 wherein the first depth for the plurality of dielectric regions is less than the thickness of the semiconductor layer.

* * * * *